United States Patent
Shimizu et al.

(10) Patent No.: US 7,344,603 B2
(45) Date of Patent: Mar. 18, 2008

(54) SOLVENT FOR TREATING POLYSILAZANE AND METHOD OF TREATING POLYSILAZANE WITH THE SOLVENT

(75) Inventors: Yasuo Shimizu, Shizuoka (JP); Tadashi Suzuki, Tokyo (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 83 days.

(21) Appl. No.: 10/499,374

(22) PCT Filed: Dec. 19, 2002

(86) PCT No.: PCT/JP02/13323

§ 371 (c)(1),
(2), (4) Date: Jun. 16, 2004

(87) PCT Pub. No.: WO03/056615

PCT Pub. Date: Jul. 10, 2003

(65) Prior Publication Data

US 2005/0027089 A1   Feb. 3, 2005

(30) Foreign Application Priority Data

Dec. 27, 2001   (JP)   ............................ 2001-396328

(51) Int. Cl.
*B08B 3/00* (2006.01)
(52) U.S. Cl. .................. 134/34; 134/2; 134/36; 134/42; 510/109; 510/405; 510/407
(58) Field of Classification Search ............... 510/109, 510/405, 407; 134/2, 36, 42, 34
See application file for complete search history.

(56) References Cited

U.S. PATENT DOCUMENTS

| | | | |
|---|---|---|---|
| 3,615,826 A * | 10/1971 | Brill et al. ................ 134/29 |
| 3,892,583 A | 7/1975 | Winter et al. |
| 3,983,047 A * | 9/1976 | Vinson .................... 510/200 |
| 4,135,878 A * | 1/1979 | Bishop et al. ............. 8/139 |
| 4,664,721 A * | 5/1987 | Valasek .................... 134/26 |
| 4,840,778 A | 6/1989 | Arai et al. |
| 4,975,512 A | 12/1990 | Funayama et al. |
| 5,030,744 A | 7/1991 | Funayama et al. |
| 5,079,323 A | 1/1992 | Funayama et al. |
| 5,292,830 A | 3/1994 | Funayama et al. |
| 5,338,475 A * | 8/1994 | Corey et al. ............ 510/280 |
| 5,340,493 A * | 8/1994 | Principato ............... 510/170 |
| 5,354,506 A * | 10/1994 | Niebylski .............. 252/389.31 |
| 5,376,599 A * | 12/1994 | Oshima et al. ........... 501/90 |
| 5,474,807 A * | 12/1995 | Koshiishi ................ 427/240 |
| 5,494,978 A | 2/1996 | Shimizu et al. |
| 5,643,033 A * | 7/1997 | Gnade et al. ............ 445/24 |
| 5,779,928 A * | 7/1998 | Yamashita et al. ...... 216/92 |
| 6,413,202 B1 * | 7/2002 | Leonte et al. ........... 528/169 |
| 6,489,252 B2 * | 12/2002 | Goo et al. ............... 438/758 |
| 6,627,559 B2 * | 9/2003 | Shindo .................... 438/780 |
| 2002/0105728 A1 * | 8/2002 | Yamaguchi et al. ........ 359/580 |
| 2003/0164113 A1 * | 9/2003 | Suzuki .................... 106/18.32 |
| 2004/0028828 A1 * | 2/2004 | Aoki et al. .............. 427/387 |
| 2005/0027089 A1 | 2/2005 | Shimizu et al. |
| 2005/0119402 A1 | 6/2005 | Suzuki et al. |
| 2005/0279255 A1 * | 12/2005 | Suzuki et al. .......... 106/287.11 |

FOREIGN PATENT DOCUMENTS

| | | |
|---|---|---|
| JP | 61-89230 | 5/1986 |
| JP | 63-81122 | 4/1988 |
| JP | 63-191832 | 8/1988 |
| JP | 1-98036 | 4/1989 |
| JP | 1-138107 | 5/1989 |
| JP | 1-138108 | 5/1989 |
| JP | 2-277427 | 3/1990 |
| JP | 2-175726 | 7/1990 |
| JP | 3-31326 | 2/1991 |
| JP | 4-63833 | 2/1992 |
| JP | 5-238827 | 9/1993 |
| JP | 5-331293 | 12/1993 |
| JP | 6-122852 | 5/1994 |
| JP | 6-240208 | 8/1994 |
| JP | 6-299118 | 10/1994 |
| JP | 6-306329 | 11/1994 |
| JP | 7-196986 | 8/1995 |
| JP | 08279445 | * 10/1996 |
| JP | 9-31333 | 2/1997 |
| JP | 9-125006 A | 5/1997 |
| JP | 10-194719 | 7/1998 |
| JP | 10-194873 | 7/1998 |
| JP | 10-212114 A | 8/1998 |
| JP | 11-105185 | 4/1999 |
| JP | 11-233510 A | 8/1999 |

OTHER PUBLICATIONS

International Search Report of PCT/JP02/13323.

(Continued)

*Primary Examiner*—Sharidan Carrillo
(74) *Attorney, Agent, or Firm*—Alan P. Kass

(57) ABSTRACT

Polysilazane is treated with a single or mixed solvent comprising one or more members selected from the group consisting of xylene, anisole, decalin, cyclohexane, cyclohexene, methylcyclohexane, ethylcyclohexane, limonene, hexane, octane, nonane, decane, a C8-C11 alkane mixture, a C8-C11 aromatic hydrocarbon mixture, an aliphatic/alicyclic hydrocarbon mixture containing 5 to 25% by weight of C8 or more aromatic hydrocarbons, and dibutyl ether, wherein the number of 0.5 micron or more fine particles contained in 1 ml of the solvent is 50 or less. As the treatment of polysilazane, there are illustrated, for example, edge-rinsing and back rinsing of a polysilazane film formed by spin coating polysilazane on a semiconductor substrate. The water content of the solvent is preferably 100 ppm or less.

2 Claims, No Drawings

OTHER PUBLICATIONS

English language abstract of JP11-105185.
English language abstract of JP10-194873.
English language abstract of JP10-194719.
English language abstract of JP10-98036.
English language abstract of JP61-89230.
English language abstract of JP63-81122.
English language abstract of JP63-191832.
English language abstract of JP2-77427.
English language abstract of JP1-138108.
English language abstract of JP1-138107.
English language abstract of JP4-63833.
English language abstract of JP2-175726.
English language abstract of JP5-331293
English language abstract of JP3-31326.
English language abstract of JP5-238827.
English language abstract of JP6-122852.
English language abstract of JP6-299118.
English language abstract of JP6-306329.
English language abstract of JP6-240208.
English language abstract of JP7-196986.
English language abstract of JP9-31333.
"A Liquid Silazane Precursor To Silicon Nitride", by Dietmar Seyferth et al., Preprinted from the Journal of the American Ceramic Society, vol. 66, No. 1, Jan. 1983.
"Polysilazane Routes to Silicon Nitride", by Dietmar Seyferth et al., Polymer Preparation American Chemistry Society, Division Polymer Chemistry, 25, 10 (1984).
"High-Yield Synthesis of Si3N4/SiC Ceramic Materials by Pyrolosis of a Novel Polyorganosilazane", by Dietmar Seyferth et al., Communications of the American Ceramic Society, C-132, Jul. 1984.
English Language Abstract of JP 9-125006 A.
English Language Abstract of JP 11-233510 A.
English Language Abstract of JP 10-212114 A.

* cited by examiner

SOLVENT FOR TREATING POLYSILAZANE AND METHOD OF TREATING POLYSILAZANE WITH THE SOLVENT

This application is a United States National Stage Patent Application under 35 U.S.C. § 371 of International Patent Application No. PCT/JP02/13323, filed Dec. 19, 2002, which claims priority to Japanese Patent Application No. 2001-396328, filed Dec. 27, 2001.

TECHNICAL FIELD

The present invention relates to a solvent for treating polysilazane suitably usable for treating a polysilazane coat, a coated polysilazane film or the like formed on a base material, and a method of treating polysilazane using the solvent.

BACKGROUND ART

It has conventionally been well known to use a siliceous film as an insulating film, a dielectric film, a protective film or a hydrophilicity-imparting film. As a method for forming such siliceous film on a base material, there have been employed various methods such as a PVD method (sputtering method or the like), a CVD method, a sol-gel method and a method of forming a polysiloxane or polysilazane coat and converting this coat to a siliceous film by calcination or the like. Of these methods, the PVD method and the CVD method involve the problem that they require expensive apparatuses and complicated control for forming a good coat. Also, the sol-gel method involves a problem that it requires a calcination temperature as high as 500° C. or higher. Further, the method of using polysiloxane involves a problem that cracks are generated due to reduction in thickness of formed film. On the other hand, the method of applying a polysilazane solution to form a coat and converting this coat to a siliceous film has been particularly noted in recent years since it enables one to easily form a siliceous film having excellent properties by low-temperature calcination and the formed siliceous film has excellent film quality.

The siliceous film is being widely utilized as, for example, an interlayer dielectric film, a planarization film, a passivation film or an element-separating insulator for semiconductor elements in LSI or TFT liquid crystal devices. In the case of forming such siliceous film in semiconductor elements or the like, the following method is commonly employed. That is, first, a polysilazane solution is spin-coated on a substrate having a stepped or non-stepped surface and, as needed, having formed thereon semiconductors, wiring or electrodes, and is heated to remove a solvent from the coat, followed by calcination at a temperature of 350° C. or above to convert polysilazane to a siliceous film. The thus-converted siliceous film is utilized as an interlayer dielectric film, a planarization film, a passivation film or an element-separating insulator. In these methods, however, it is well known that, upon spin-coating the polysilazane solution on a substrate, beads are formed at the periphery of the substrate and, at the same time, the solution spreads to the back side of the substrate. In order to prevent non-uniformity in thickness of the coat at the periphery of the substrate generated by the beads, it is usually conducted to rinse the edge in forming the polysilazane film by applying the polysilazane solution and, at the same time, back rinse in order to remove polysilazane having spread and deposited onto the back side of the substrate to thereby clean the back side.

In some cases, it is required to peel off the coated polysilazane film formed according to the above-mentioned method from the substrate, and it is also required to wash away polysilazane having deposited on a coating apparatus such as a spin-coater. It has conventionally been known to use, for example, propylene glycol monomethyl ether acetate (PGMEA) as a rinsing solution or a peeling solution for removing polysilazane. However, the known rinsing solution or peeling solution involves such problem as that polysilazane cannot be fully rinsed away or peeled off or that, though polysilazane is fully rinsed away or peeled off, there sometimes arises clogging of a waste liquor line for a coating apparatus such as a spin-coater due to gelation of the waste liquor or generation of a gas such as silane, hydrogen or ammonia in a waste liquor tank. In the case where gelation of the waste liquor takes place, it is required to often wash the coating apparatus and the waste liquor line and, in the case where a silane gas or the like generates in the waste liquor tank and the concentration of silane exceeds the spontaneous ignition limit, there arises an extremely dangerous state that explosion takes place the moment that the lid of the waste liquor tank is opened.

The siliceous film formed from the polysilazane coat is being used in various fields as a dielectric film, an insulating film or a partitioning film for a liquid crystal display device or a plasma display panel (PDP) and, further, as a protective film for various articles such as the surface of car body, interior or exterior furnishings of a house, glass products, china and porcelain products and plastic products other than the field of semiconductor elements. Also in these fields, there sometimes arises the problem that the polysilazane film having deposited onto unnecessary portions to be coated must be removed as is the same with the case of producing semiconductor elements.

An object of the present invention is to provide a solvent for treating polysilazane, which does not cause the above-mentioned problems upon rinsing or peeling of a polysilazane coat or a coated film, and a method of treating polysilazane by use of the solvent.

That is, the object of the present invention is to provide a solvent for treating polysilazane, which shows excellent properties of dissolving polysilazane and does not adversely affect the properties of a ground such as a semiconductor or a substrate and properties of the remaining polysilazane coat, and a method of treating polysilazane by use of the solvent.

Another object of the present invention is to provide a solvent for treating polysilazane, which shows, in addition to the above-mentioned properties, excellent edge-cutting properties for a polysilazane coat and scarcely decomposes polysilazane, and a method of treating polysilazane by use of the solvent.

DISCLOSURE OF THE INVENTION

As a result of intensive investigations to solve the problems, the inventor has found that a treating solution including a rinsing or a peeling solution for removing polysilazane is required to possess, needless to say, the properties of efficiently dissolving polysilazane and showing good edge-cutting ability and, further, to contain a reduced amount of particles and a reduced amount of metal impurities in the solvent so as to avoid adversely affecting the properties of a ground and the properties of a siliceous film to be formed and that the solvent itself should have no groups which decompose polysilazane (e.g., a hydroxyl group or an ester group) and should scarcely absorb moisture in order to prevent clogging of a waste liquor line and generation of a silane gas or the like in a waste liquor tank, thus having achieved the present invention based on the findings.

That is, the present invention provides a solvent for treating polysilazane, which is a single or mixed solvent comprising one or more members selected from the group consisting of xylene, anisole, decalin, cyclohexane, cyclohexene, methylcyclohexane, ethylcyclohexane, limonene, hexane, octane, nonane, decane, a C8-C11 alkane mixture, a C8-C11 aromatic hydrocarbon mixture, an aliphatic/alicyclic hydrocarbon mixture containing 5 to 25% by weight of C8 or more aromatic hydrocarbons, and dibutyl ether, wherein the number of 0.5 micron or more fine particles contained in 1 ml of the solvent is 50 or less.

Also, the invention provides the solvent for treating polysilazane as described above, which is a mixed solvent comprising 50% or more by weight of xylene, a C8-C11 aromatic hydrocarbon mixture, or an aliphatic/alicyclic hydrocarbon mixture containing 5 to 25% by weight of C8 or more aromatic hydrocarbons.

Further, the invention provides the solvent for treating polysilazane as described above, which further comprises mineral spirit as a diluent solvent.

Furthermore, the invention provides the solvent for treating polysilazane as described above, wherein the water content of the solvent is 100 ppm or less.

Still further, the invention provides the solvent for treating polysilazane as described above, wherein the polysilazane to be treated with the solvent is perhydropolysilazane, methanol-added perhydropolysilazane or hexamethyl disilazane-added perhydropolysilazane.

Still further, the invention provides a method of treating polysilazane, which comprises contacting the solvent described above with polysilazane.

Yet further, the invention provides the method of treating polysilazane as described above, wherein the contact of the solvent with polysilazane is conducted, after applying a polysilazane solution onto a substrate, by jetting the solvent onto the edge of the polysilazane-coated surface of the substrate or the back of the substrate.

SPECIFIC EMBODIMENT OF THE INVENTION

The invention is described in more detail below.

In the invention, a single or mixed solvent comprising one or more members selected from the group consisting of xylene, anisole, decalin, cyclohexane, cyclohexene, methylcyclohexane, ethylcyclohexane, limonene, hexane, octane, nonane, decane, a C8-C11 alkane mixture, a C8-C11 aromatic hydrocarbon mixture such as Solvesso 100 or Solvesso 150 (manufactured by Exxon Mobil Co.), an aliphatic/alicyclic hydrocarbon mixture containing 5 to 25% by weight of C8 or more aromatic hydrocarbons such as Pegasol AN45 (manufactured by Exxon Mobil Co.), and dibutyl ether is used as a solvent. The number of 0.5 micron or more fine particles contained in 1 ml of the solvent is required to be 50 or less, with 10 or less being preferred. In the case where the number of 0.5 micron or more fine particles contained in 1 ml of the solvent exceeds 50, it suffices to remove fine particles contained in the solvent through a proper means such as filtration or distillation so that the number of 0.5 micron or more fine particles in 1 ml of the solvent becomes 50 or less. Because, in the case where the number of 0.5 micron or more fine particles contained in 1 ml of the solvent exceeds 50, the fine particles partly remain in some cases in the treated polysilazane film and, in such case, there may result deterioration of insulating properties and dielectric properties upon formation of a siliceous film by calcination of the polysilazane film, or there may arise a problem that, since the particles deposit onto the polysilazane-coated semiconductor substrate, properties of semiconductors are deteriorated or, in some cases, that reduction in yield of devices due to short-circuit or conduction failure takes place. The problems of deterioration of insulating properties, dielectric properties and semiconductor properties and short-circuit are often experienced in the case where the fine particles are metal particles. Hence, it is desirable to reduce the content of metal fine particles to zero. Further, it is more preferred that the number of 0.2 μm or more particles is 400 or less.

Every solvent of the present invention described hereinbefore shows an excellent polysilazane-dissolving ability. Therefore, it is also possible that, in the case of using aromatic hydrocarbons, they may be used not as a single solvent but as a mixed solvent together with the aliphatic hydrocarbon, alicyclic hydrocarbon or dibutyl ether among the above-described solvents. That is, in the case of using, as a solvent, xylene, a C8-C11 aromatic hydrocarbon mixture (e.g., Solvesso 100 or Solvesso 150) or an aliphatic/alicyclic hydrocarbon mixture containing 5 to 25% by weight of C8 or more hydrocarbons (e.g., Pegasol AN45), they may be used as a mixed solvent with an aliphatic hydrocarbon or an alicyclic hydrocarbon such as cyclohexane or nonane. In this case, dissolving ability of the mixed solvent can usually be enhanced when the content of the aromatic hydrocarbons in the solvent is about 10% by weight or more. In view of the ability of dissolving polysilazane, the content of the aromatic solvent is preferably larger. In particular, solvents containing 50% by weight or more xylene, a $C8-C_{11}$ aromatic hydrocarbon mixture (e.g., Solvesso 100 or Solvesso 150) or an aliphatic/alicyclic hydrocarbon mixture containing 5 to 25% by weight of C8 or more hydrocarbons (e.g., Pegasol AN45) are particularly preferred as solvents for treating polysilazane in the points that they show a good dissolving ability and good edge-cutting properties for any of perhydropolysilazane, methanol-added perhydropolysilazane and hexamethyl disilazane-added perhydropolysilazane and that they are inexpensive. Also, the solvent to be used in the invention may be diluted with a diluent solvent of mineral spirit within a range wherein the objects of the present invention are attained. Additionally, it is necessary for the number of 0.5 micron or more fine particles contained in 1 ml of the mineral spirit used here to be 50 or less. Further, since methylcyclohexane, ethylcyclohexane or the like gives off little smell, it suffices to select these solvents that give off little smell in the case where smells are required to be avoided. Additionally, Pegasol AN45 is a fraction of distillate produced by hydrogenating, for purification, a distillate oil obtained by atmospheric distillation of a crude oil, and is a petroleum series hydrocarbon mainly comprising C8-C11 hydrocarbons and being a liquid having an aniline point of 43° C.

Also, the solvent of the present invention has a water content of preferably 100 ppm or less, more preferably 80 ppm or less. In case where the water content exceeds 100 ppm, gelation due to decomposition of polysilazane in contact with the solvent takes place within a short time, which leads to such problem as that clogging of a waste liquor line of a spin coater takes place and that it takes a long time to remove polysilazane deposited onto the spin coater, thus such water content not being preferred. In addition, contact of polysilazane removed from a substrate with water in a waste liquor tank leads to generation of a gas such as silane, hydrogen or ammonia and, in the case where the concentration of silane exceeds the spontaneous ignition temperature, there might result, in the worst case, an explosion of the waste liquor tank as has been described hereinbefore.

Also, a preferred single or mixed solvent depends on the structure or composition of a polysilazane to be treated. Because, even when the same solvent is used, solubility of polysilazane varies depending upon various factors such as: whether the polysilazane is an inorganic polysilazane or an organic polysilazane; whether the polysilazane is a homopolymer or a copolymer; kinds of comonomers when the polysilazane is a copolymer; whether the polysilazane has a cyclic structure in the polymer or not; whether the polysilazane is further chemically modified; and whether additives are separately added or not and because the solubility of the same polysilazane varies depending upon kind of the solvent. Therefore, all that is required is to select a proper and optimal solvent from among the above-mentioned solvents of the invention depending upon the structure or composition of a polysilazane to be treated.

On the other hand, the polysilazane to which the solvent of the invention is applied may be either inorganic one or organic one. Of the polysilazanes, examples of the inorganic polysilazane include perhydropolysilazanes containing a straight chain structure having a structural unit represented by the general formula:

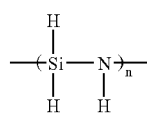
(I)

and having a molecular weight of 690 to 2,000, 3 to 10 $SiH_3$ groups per molecule, and an element ratio by weight of Si:N:H=59 to 61:31 to 34:6.5 to 7.5 determined by chemical analysis (JP-B-63-16325) and perhydropolysilazanes having an average molecular weight of 3,000 to 20,000 as determined by polystyrene standards.

These perhydropolysilazanes can be produced by the process described in JP-B-63-16325 mentioned above or the process reported by, for example, D. Seyferth et al., Communication of Am. Cer. Soc., C-13, January 1983 and basically contain both a chain moiety and a cyclic moiety within the molecule. They can be represented by the chemical formula:

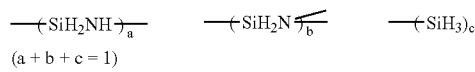
(a + b + c = 1)

One example of the perhydropolysilazane structure is shown below:

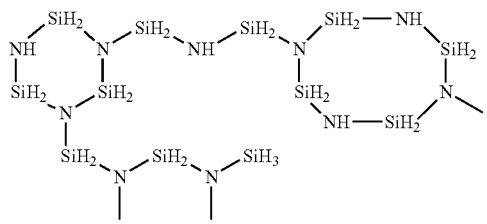

As the solvent suited for treating these perhydropolysilazanes, there is illustrated a single or mixed solvent comprising one or more members selected from the group consisting of xylene, anisole, decalin, cyclohexane, cyclohexene, methylcyclohexane, ethylcyclohexane, limonene, a C8-C11 aromatic hydrocarbon mixture, a paraffin/cycloparaffin hydrocarbon mixture containing 5 to 25% by weight of C8 or more aromatic hydrocarbons, and dibutyl ether, wherein the number of 0.5 micron or more fine particles contained in 1 ml of the solvent is 50 or less, preferably with the water content being more 100 ppm or less. Also, these solvents may be used by diluting with a mineral spirit as needed.

As examples of other polysilazanes, there are illustrated polysilazanes having a skeleton mainly comprising the structural unit represented by the general formula:

(II)

wherein $R^1$, $R^2$ and $R^3$ each independently represent a hydrogen atom, an alkyl group, an alkenyl group, a cycloalkyl group, an aryl group, a group other than these groups which is directly bound to the silicon atom through carbon such as a fluoroalkyl group, an alkylsilyl group, an alkylamino group or an alkoxy group, provided that at least one of $R^1$, $R^2$ and $R^3$ is a hydrogen atom and having a number-average molecular weight of about 100 to about 50,000, and modified products thereof.

The process for producing, for example, polysilazanes represented by the above general formula (II) wherein $R^1$ and $R^2$ each represent a hydrogen atom and $R^3$ represents a methyl group is reported by D. Seyferth et al, Polym. Prepr. Am. Chem. Soc., Div. Polym. Chem., 25, 10(1984). Polysilazanes obtained by this process are chain polymers having a repeating unit of —($SiH_2NCH_3$)— and cyclic polymers, both not having a cross-linked structure.

Also, the process for producing polyorgano (hydro) silazanes represented by the above general formula (II) wherein $R^1$ and $R^2$ each represent a hydrogen atom, and $R^3$ represents an organic group is reported by D. Seyferth et al, Polym. Prepr. Am. Chem. Soc., Div. Polym. Chem., 25, 10 (1984) and JP-A-61-89230. Polysilazanes obtained by these processes include those which have a repeating unit of —($R^2SiHNH$)— and mainly a cyclic structure of 3 to 5 in polymerization degree and those which have both a chain structure and a cyclic structure within the molecule shown by the chemical formula of $(R^3SiHNH)_x[(R^2SiH)_{1.5}N]_{1-x}$ (0.4<X<1).

Further, there are polysilazanes of the above general formula (II) wherein $R^1$ represents a hydrogen atom and $R^2$ and $R^3$ each represent an organic group and those of the formula (II) wherein $R^1$ and $R^2$ each represent an organic group and $R^3$ represents a hydrogen atom and which has a repeating unit of $—(R^1R^2SiNR^3)—$ and mainly a cyclic structure of 3 to 5 in polymerization degree.

Also, as organic polysilazanes other than those represented by the above general formula (II), there are illustrated, for example, polyorgano(hydro)silazanes having a cross-linked structure within the molecule represented by the general formula:

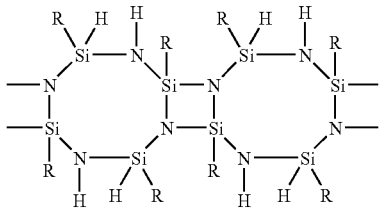

R = CH$_3$ (D. Seyferth et al., Communication of Am. Cer. Soc. C-132, July 1984), polysilazanes $R^1Si(NH)_x$ having a cross-linked structure and being obtained by ammonolysis of $R^1SiX_3$ (X: halogen) and polysilazanes having the following structure and being obtained by coammonolysis of $R^1SiX_3$ and $R^2_2SiX_2$ (JP-A-49-69717)

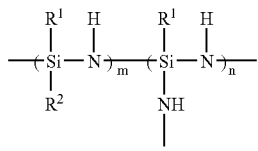

(m, n: positive integers)

Also, as modified polysilazanes, polymetallosilazanes containing a metal atom as shown by the following structure (wherein a metal atom on the side chain, M, may form a crosslinkage) may also be used as a starting material:

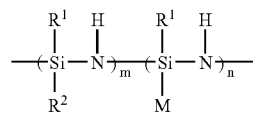

(m, n: positive integers)
(M: metal atom)

Further, there may be illustrated polysiloxazanes whose repeating units are represented by $[(SiH_2)_n(NH)_m]$ and $[(SiH_2)_rO]$ (wherein n, m and r each represent 1, 2 or 3) (JP-A-62-195024), polyborosilazanes excellent in heat resistance and produced by reacting polysilazane with a boron compound (JP-A-2-84437), polymetallosilazanes produced by reacting polysilazane with a metal alkoxide (JP-A-63-81122, JP-A-63-191832, and JP-A-2-77427), inorganic silazane high polymers or modified polysilazanes having an increased molecular weight or an improved resistance against hydrolysis (JP-A-1-138108, JP-A-1-138107, JP-A-1-203429, JP-A-1-203430, JP-A-4-63833, and JP-A-3-320167), copolymerized silazanes produced by introducing an organic component into polysilazane, which is advantageous for increasing the film thickness (JP-A-2-175726, JP-A-5-86200, JP-A-5-331293, and JP-A-3-31326), and polysilazasnes which are produced by adding to polysilazane a catalytic compound for accelerating conversion to ceramics and which can be converted to ceramics at a lower temperature and can be applied to plastics or metals such as aluminum (JP-A-5-238827, JP-A-6-122852, JP-A-6-299118, JP-A-6-306329, JP-A-6-240208, and JP-A-7-196986).

Further, there may be illustrated polysilazanes which can be converted to ceramics at low temperature, such as silicon alkoxide-added polysilazanes (JP-A-5-238827), glycidol-added polysilazanes (JP-A-6-122852), acetylacetonato complex-added polysilazanes (JP-A-6-306329), metal carboxylate-added polysilazanes (JP-A-6-299118).

Also, as other polysilazanes, there may be illustrated a polysilazane composition prepared by adding an amine and/or an acid to the various polysilazanes or modified polysilazanes described above, as described in JP-A-9-31333. In the case of using this composition as polysilazane, there may preferably be used as a treating solvent any of a single and mixed solvents comprising one or more members selected from the group consisting of xylene, anisole, decalin, cyclohexane, cyclohexene, methylcyclohexane, ethylcyclohexane, limonene, hexane, octane, nonane, decane, a C8-C11 alkane mixture, a C8-C11 aromatic hydrocarbon mixture, an aliphatic/alicyclic hydrocarbon mixture containing 5 to 25% by weight of C8 or more aromatic hydrocarbons, and dibutyl ether.

As other polysilazanes, there may be illustrated modified polysilazanes obtained by adding an alcohol such as methanol to perhydropolysilazane (JP-A-5-345826) and modified polysilazanes obtained by adding hexamethyl disilazane to the terminal N atom (JP-A-4-63833).

As to the form of polysilazane to which the solvent of the invention is to be applied, polysilazane is usually in a coated film form, but the form is not limited only to a coated film. Also, as a method for coating polysilazane on a substrate, any of conventionally known methods such as a spin coating method, a spray coating method, a flow coating method, a roller coating method, a dip coating method, a cloth-wiping method and a sponge-wiping method may be employed with no limitations. The form of the base material may be any of plate, film, and the like, and the surface state may be flat, uneven or curved. The material of the base material may be any of semiconductors, glasses, metals, metal oxides and plastics.

Also, the manner of contacting the solvent of the present invention with polysilazane is not limited at all, and the contact may be conducted by any of, for example, jetting or spraying the solvent through a nozzle against polysilazane on the base material, dipping the polysilazane-coated base material in the solvent and washing away polysilazane with the solvent.

To illustrate the method of contacting polysilazane with the solvent of the present invention taking as an example the case wherein a polysilazane solution is applied to a semiconductor substrate (silicon wafer) and forming on the semiconductor substrate an interlayer dielectric film, a planarization film, a passivation film or an element-separating film, a 4-inch silicon wafer having formed thereon as needed semiconductors or wirings is mounted on a spin coater, a polysilazane solution is applied by spin coating method on the wafer rotating at a rotation speed of, for example, 500 to 4000 rmp, then the solvent of the present invention is jetted as a washing solution (rinsing solution) against the edge portion and the back of the polysilazane-coated wafer rotated at a rotation speed of, for example, 500 to 4000. Thus, the contact of the solvent with polysilazane is effected, resulting in removal of beads in the edge portion of the wafer, planarization of the coat, and removal of the polysilazane coat spreading to the back of the wafer.

EXAMPLES

The present invention is specifically described below by reference to examples which, however, are not to be construed as limiting the invention in anyway. Additionally, in the following Examples, polysilazanes descdribed in Reference Examples 1 to 3 were used.

Reference Example 1

Synthesis of Perhydropolysilazane

A 300-ml, four-necked flask was equipped with a gas-introducing tube, a mechanical stirrer and a Dewar condenser. After replacing the atmosphere within the reactor with deoxidized dry nitrogen, 150 ml of deaerated dry pyridine was placed in the four-necked flask, then ice-cooled. Subsequently, 16.1 g of dichlorosilane was added thereto over 50 minutes to generate a white, solid adduct ($SiH_2Cl_2·2Py$). The reaction mixture was ice-cooled and, under vigorous stirring, 10.9 g of purified ammonia through a soda lime tube and an activated carbon tube was bubbled into the mixture over 1 hour as a mixed gas with nitrogen. After completion of the reaction, a solid product was removed by centrifugal separation and filtration. The solvent was removed from the filtrate under reduced pressure (50° C., 5 mmHg, 2 hours) to obtain 5.52 g of a glassy, solid polysilazane. The molecular weight of the product measured by the vapor pressure depression method was 2,000. Yield was 77%.

Reference Example 2

Synthesis of Methanol-Added Perhydropolysilazane

Methanol-added perhydropolysilazane was synthesized according to Example 1 in JP-A-5-345826. The resultant methanol-added perhydropolysilazane contains the structure as shown below:

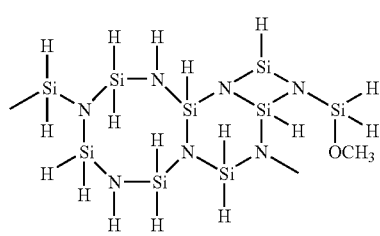

Reference Example 3

Synthesis of Hexamethyl Disilazane-Added Perhydropolysilazane

Hexamethyl disilazane-added perhydropolysilazane was synthesized according to Example 1 in JP-A-4-63833. The resultant hexamethyl disilazane-added perhydropolysilazane contains the structure as shown below:

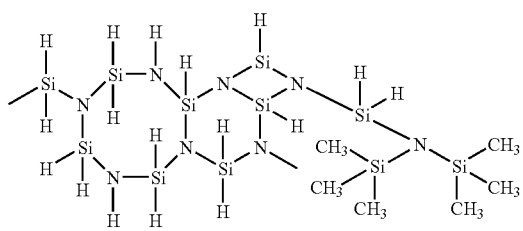

Examples 1 to 15 and Comparative Examples 1 to 3

The perhydropolysilazane obtained in Reference Example 1 was evaluated in terms of days required for gelation of perhydropolysilazane (gelation days), amount of generated gas and edge-cutting properties in the following manners, respectively, using washing agents described in Table 1. Results are shown in Table 2.

(Method for Evaluating Gelation Days)

5 g of a 20% by weight solution of perhydropolysilazane in di-n-butyl ether and 50 g of a washing agent were placed and mixed in a 100-g glass bottle, and was allowed to stand in a room of 22° C. in temperature and 50% RH in humidity without plugging the bottle, and days required for gelation was visually observed.

(Method for Evaluating the Amount of Generated Gas)

5 g of a 20% by weight solution of perhydropolysilazane in di-n-butyl ether and 50 g of a washing agent were placed and mixed in a 100-g glass bottle, and the bottle was closely plugged. After 1 hour, the gas phase was sampled and subjected to gas chromatography to measure.

(Method for Evaluating Edge-Cutting Properties)

A 20% by weight solution of perhydropolysilazane obtained in Reference Example 1 in di-n-butyl ether was spin coated at a rotation number of 1,000 rpm for 10 seconds using Clean Truck Mark-8 manufactured by Tokyo Electron Limited, followed by jetting a washing solution against the film-coated surface and the back at a rotation number of 2,000 rpm for 5 seconds to conduct rinsing of the wafer. Peeling properties (edge-cutting properties) of the perhydropolysilazane was observed under an optical microscope (100×). Jetting of the washing solution against the film-coated surface and the back was conducted at a position 3 mm inside the periphery of the wafer.

TABLE 1

| Examples & Comparative | | Particle (Number/ml) | | Water Content |
|---|---|---|---|---|
| Examples | Washing Solution | >0.5 μm | >0.2 μm | wt % |
| Example 1 | Solvesso 100 | 5 | 30 | 0.002 |
| Example 2 | Solvesso 150 | 2 | 10 | 0.003 |
| Example 3 | Pegasol AN45 | 2 | 50 | 0.002 |

TABLE 1-continued

| Examples & Comparative Examples | Washing Solution | Particle (Number/ml) >0.5 μm | Particle (Number/ml) >0.2 μm | Water Content wt % |
|---|---|---|---|---|
| Example 4 | decalin | 5 | 80 | 0.005 |
| Example 5 | cyclohexane | 3 | 30 | 0.002 |
| Example 6 | cyclohexene | 3 | 40 | 0.002 |
| Example 7 | methylcyclohexane | 8 | 40 | 0.002 |
| Example 8 | ethylcyclohexane | 2 | 20 | 0.002 |
| Example 9 | limonene | 8 | 80 | 0.01 |
| Example 10 | Solvesso 100 (50%) + cyclohexane (50%) | 2 | 20 | 0.002 |
| Example 11 | Pegasol AN45 (50%) + decalin (50%) | 3 | 80 | 0.002 |
| Example 12 | xylene | 1 | 50 | 0.001 |
| Example 13 | xylene (50%) + n-nonane (50%) | 2 | 40 | 0.002 |
| Comparative Example 1 | dibutyl ether (not dehydrated; water content: 300 ppm) | 3 | 40 | 0.002 |
| Example 14 | dibutyl ether (dehydrated; water content: 20 ppm) | 3 | 40 | 0.005 |
| Example 15 | anisole | 5 | 30 | 0.05 |
| Comparative Example 2 | propylene glycol monomethyl ether | 5 | 20 | 0.02 |
| Comparative Example 3 | propylene glycol monomethyl ether acetate | 1 | 20 | 0.01 |

TABLE 2

| Examples & Comparative Examples | Gelation Days | Generated Gas (vol %) monosilane | Generated Gas (vol %) hydrogen | Edge-cutting Properties Top rinse | Edge-cutting Properties Back rinse |
|---|---|---|---|---|---|
| Example 1 | 8 | 0.001 | 0.05 | good | good |
| Example 2 | 9 | 0.001 | 0.03 | good | good |
| Example 3 | 8 | 0.001 | 0.03 | good | good |
| Example 4 | 6 | 0.003 | 0.1 | good | good |
| Example 5 | 4 | 0.005 | 0.1 | good | good |
| Example 6 | 4 | 0.005 | 0.1 | good | good |
| Example 7 | 5 | 0.003 | 0.03 | good | good |
| Example 8 | 4 | 0.003 | 0.02 | good | good |
| Example 9 | 3 | 0.01 | 0.15 | good | good |
| Example 10 | 7 | 0.001 | 0.03 | good | good |
| Example 11 | 8 | 0.001 | 0.02 | good | good |
| Example 12 | 8 | 0.001 | 0.01 | good | good |
| Example 13 | 8 | 0.002 | 0.05 | good | good |
| Comparative Example 1 | 0.5 | 0.04 | 1.2 | good | good |
| Example 14 | 3 | 0.008 | 0.1 | good | good |
| Example 15 | 4 | 0.08 | 0.2 | good | good |
| Comparative Example 2 | >20 | 1.5 | 30 | good | good |
| Comparative Example 3 | 0.5 | 0.5 | 25 | good | good |

TABLE 3

| Examples & Comparative Examples | Washing Solution | Particle (Number/ml) >0.5 μm | Particle (Number/ml) >0.2 μm | Water Content wt % |
|---|---|---|---|---|
| Example 16 | Solvesso 100 | 5 | 30 | 0.002 |
| Example 17 | Solvesso 150 | 2 | 10 | 0.003 |
| Example 18 | Pegasol AN45 | 2 | 50 | 0.002 |
| Example 19 | decalin | 5 | 80 | 0.005 |
| Example 20 | cyclohexane | 3 | 30 | 0.002 |
| Example 21 | cyclohexene | 3 | 40 | 0.002 |
| Example 22 | methylcyclohexane | 8 | 40 | 0.002 |
| Example 23 | ethylcyclohexane | 2 | 20 | 0.002 |
| Example 24 | limonene | 8 | 80 | 0.01 |
| Example 25 | Solvesso 100 (50%) + cyclohexane (50%) | 2 | 20 | 0.002 |
| Example 26 | Pegasol AN45 (50%) + decalin (50%) | 3 | 80 | 0.002 |
| Example 27 | xylene | 1 | 50 | 0.001 |
| Example 28 | xylene (50%) + n-nonane (50%) | 2 | 40 | 0.002 |
| Comparative Example 4 | dibutyl ether (not dehydrated; water content: 300 ppm) | 3 | 40 | 0.002 |
| Example 29 | dibutyl ether (dehydrated; water content: 20 ppm) | 3 | 40 | 0.005 |
| Example 30 | anisole | 5 | 30 | 0.05 |
| Comparative Example 5 | propylene glycol monomethyl ether | 5 | 20 | 0.02 |
| Comparative Example 6 | propylene glycol monomethyl ether acetate | 1 | 20 | 0.01 |

TABLE 4

| Examples & Comparative Examples | Gelation Days | Generated Gas (vol %) monosilane | Generated Gas (vol %) hydrogen | Edge-cutting Properties Top rinse | Edge-cutting Properties Back rinse |
|---|---|---|---|---|---|
| Example 16 | 9 | 0.002 | 0.1 | good | good |
| Example 17 | 9 | 0.001 | 0.1 | good | good |
| Example 18 | 9 | 0.002 | 0.05 | good | good |
| Example 19 | 6 | 0.002 | 0.05 | good | good |
| Example 20 | 5 | 0.005 | 0.05 | good | good |
| Example 21 | 4 | 0.001 | 0.1 | good | good |
| Example 22 | 5 | 0.005 | 0.03 | good | good |
| Example 23 | 7 | 0.01 | 0.08 | good | good |
| Example 24 | 3 | 0.01 | 0.08 | good | good |
| Example 25 | 7 | 0.002 | 0.05 | good | good |
| Example 26 | 8 | 0.002 | 0.05 | good | good |
| Example 27 | 10 | 0.002 | 0.03 | good | good |
| Example 28 | 12 | 0.003 | 0.07 | good | good |
| Comparative Example 4 | 1 | 0.08 | 0.9 | good | good |
| Example 29 | 4 | 0.01 | 0.08 | good | good |
| Example 30 | 7 | 0.02 | 0.2 | good | good |
| Comparative Example 5 | >20 | 2.2 | 45 | good | good |
| Comparative Example 6 | 1 | 1.2 | 30 | good | good |

Examples 16 to 30 and Comparative Examples 4 to 6

The methanol-added perhydropolysilazane obtained in Reference Example 2 was evaluated in terms of days required for gelation of perhydropolysilazane (gelation days), amount of generated gas and edge-cutting properties in the same manners as in Example 1 using washing agents described in Table 3. Results are shown in Table 4.

Examples 31 to 55 and Comparative Examples 7 to 9

The hexamethyl disilazane-added perhydropolysilazane obtained in Reference Example 3 was evaluated in terms of days required for gelation of perhydropolysilazane (gelation days), amount of generated gas and edge-cutting properties in the same manners as in Example 1 using washing agents described in Table 5. Results are shown in Table 6.

TABLE 5

| Examples & Comparative Examples | Washing Solution | Particle (Number/ml) >0.5 μm | Particle (Number/ml) >0.2 μm | Water Content wt % |
|---|---|---|---|---|
| Example 31 | Solvesso 100 | 5 | 30 | 0.002 |
| Example 32 | Solvesso 150 | 2 | 10 | 0.003 |
| Example 33 | Pegasol AN45 | 2 | 50 | 0.002 |
| Example 34 | mixture of $C_8$-$C_{11}$ alkanes | 2 | 20 | 0.001 |
| Example 35 | cyclohexane | 3 | 30 | 0.002 |
| Example 36 | cyclohexene | 3 | 40 | 0.002 |
| Example 37 | methylcyclohexane | 8 | 40 | 0.002 |
| Example 38 | ethylcyclohexane | 2 | 20 | 0.002 |
| Example 39 | limonene | 8 | 80 | 0.01 |
| Example 40 | n-hexane | 3 | 20 | 0.001 |
| Example 41 | i-hexane | 2 | 20 | 0.002 |
| Example 42 | n-heptane | 2 | 20 | 0.001 |
| Example 43 | i-heptane | 5 | 30 | 0.001 |
| Example 44 | n-octane | 5 | 70 | 0.003 |
| Example 45 | i-octane | 2 | 20 | 0.002 |
| Example 46 | n-nonane | 3 | 20 | 0.002 |
| Example 47 | i-nonane | 3 | 80 | 0.001 |
| Example 48 | n-decane | 5 | 100 | 0.002 |
| Example 49 | i-decane | 3 | 20 | 0.001 |
| Example 50 | xylene | 1 | 50 | 0.001 |
| Example 51 | xylene (50%) + n-nonane (50%) | 2 | 40 | 0.002 |
| Example 52 | Solvesso 100 (50%) + cyclohexane (50%) | 2 | 10 | 0.001 |
| Example 53 | Pegasol AN45 (50%) + i-nonane (50%) | 2 | 30 | 0.001 |
| Comparative Example 7 | dibutyl ether (not dehydrated; water content: 300 ppm) | 3 | 40 | 0.002 |
| Example 54 | dibutyl ether (dehydrated; water content: 20 ppm) | 3 | 40 | 0.005 |
| Example 55 | anisole | 5 | 30 | 0.05 |
| Comparative Example 8 | propylene glycol monomethyl ether | 5 | 20 | 0.02 |
| Comparative Example 9 | propylene glycol monomethyl ether acetate | 1 | 20 | 0.01 |

TABLE 6

| Examples & Comparative Examples | Gelation Days | Generated Gas (vol %) monosilane | Generated Gas (vol %) hydrogen | Edge-cutting Properties Top rinse | Edge-cutting Properties Back rinse |
|---|---|---|---|---|---|
| Example 31 | 10 | 0.001 | 0.1 | good | good |
| Example 32 | 10 | 0.001 | 0.02 | good | good |
| Example 33 | 9 | 0.002 | 0.03 | good | good |
| Example 34 | 13 | 0.001 | 0.04 | good | good |
| Example 35 | 12 | 0.01 | 0.05 | good | good |
| Example 36 | 12 | 0.003 | 0.05 | good | good |
| Example 37 | 9 | 0.001 | 0.02 | good | good |
| Example 38 | 9 | 0.001 | 0.1 | good | good |
| Example 39 | 7 | 0.001 | 0.1 | good | good |
| Example 40 | 12 | 0.002 | 0.1 | good | good |
| Example 41 | 12 | 0.002 | 0.05 | good | good |
| Example 42 | 15 | 0.003 | 0.03 | good | good |
| Example 43 | 15 | 0.005 | 0.04 | good | good |
| Example 44 | 12 | 0.001 | 0.04 | good | good |
| Example 45 | 10 | 0.005 | 0.01 | good | good |
| Example 46 | 12 | 0.008 | 0.05 | good | good |
| Example 47 | 12 | 0.003 | 0.05 | good | good |
| Example 48 | 12 | 0.002 | 0.06 | good | good |
| Example 49 | 14 | 0.002 | 0.01 | good | good |
| Example 50 | 15 | 0.001 | 0.03 | good | good |
| Example 51 | 12 | 0.001 | 0.03 | good | good |
| Example 52 | 12 | 0.002 | 0.1 | good | good |
| Example 53 | 12 | 0.001 | 0.02 | good | good |
| Comparative Example 7 | 1 | 0.06 | 0.7 | good | good |
| Example 54 | 4 | 0.008 | 0.03 | good | good |
| Example 55 | 9 | 0.02 | 0.2 | good | good |
| Comparative Example 8 | >20 | 1.1 | 28 | good | good |
| Comparative Example 9 | 1 | 0.9 | 15 | good | good |

Advantages of the Invention

As has been described hereinbefore, the solvent of the present invention has an excellent dissolving ability and excellent edge-cutting properties for polysilazanes, and exerts no detrimental influences on the underlying semiconductors or substrate and no influences on the properties of the polysilazane coat in the remaining area, thus being suited as a solvent for treating polysilazane. Also, the solvent of the invention does not contain groups which decompose polysilazane and contains water in an extremely small amount, and hence it can prevent clogging of a waste liquor line, reduce the cleaning work, for example, reduce the number of washing work for a coating apparatus such as a spin coater and for a waste liquor line and, further, reduce the amount of gas such as silane to be generated in the waste liquor tank, thus the solvent being excellent with respect to safety. Also, in the case where the solvent does not contain aromatic solvents, there can be provided a solvent for treating polysilazane excellently safe for human body. Further, by treating polysilazane using this solvent, polysilazane can be treated safely and inexpensively with a reduced amount for use of the solvent and with less influence on properties of the base materials and remaining film.

INDUSTRIAL APPLICABILITY

The solution of the present invention for treating polysilazane can suitably be used as an edge-rinsing solution, a back-rinsing solution or a washing solution for a coating apparatus in forming a polysilazane film for forming a siliceous coated film to be used as an interlayer dielectric film, a planarization film, or a passivation film for a semiconductor element and so on or an element-separating insulator in LSI, TFT liquid crystal display devices, etc., or as a washing solution for polysilazane film to be used as a dielectric film, insulating film or a partition film in PDP.

What is claimed is:

1. A method of removing, dissolving, rinsing or peeling polysilazane coated on an edge or a back of a substrate, which comprises contacting a composition comprising a solvent, which is a single or mixed solvent comprising one or more members selected from the group consisting of xylene, anisole, decalin, cyclohexane, cyclohexene, methylcyclohexane, ethylcyclohexane, limonene, hexane, octane, nonane, decane, a C8-C11 alkane mixture, a C8-C11 aromatic hydrocarbon mixture, an aliphatic/alicyclic hydrocarbon mixture containing 5 to 25 wt. % C8 or more aromatic hydrocarbons, and dibutyl ether, wherein the number of 0.5 micron or more fine particles contained in 1 ml of the solvent is 50 or less, and wherein the solvent has a water content of 100 ppm or less and said composition further comprises mineral spirit as a diluent solvent, with polysilazane and removing, dissolving, rinsing or peeling the polysilazane coated on the edge or the back of the substrate by jetting the composition onto the polysilazane.

2. The method of removing, dissolving, rinsing or peeling polysilazane coated on an edge or a back of a substrate according to claim 1, wherein the polysilazane is coated on the substrate by applying a polysilazane solution onto the substrate.

* * * * *